United States Patent
Yeung et al.

(10) Patent No.: US 7,205,820 B1
(45) Date of Patent: Apr. 17, 2007

(54) SYSTEMS AND METHODS FOR TRANSLATION OF SIGNAL LEVELS ACROSS VOLTAGE DOMAINS

(75) Inventors: Sally Yeung, Burnaby (CA); William Michael Lye, Coquitlam (CA)

(73) Assignee: PMC-Sierra, Inc., Santa Clara, CA (US)

( * ) Notice: Subject to any disclaimer, the term of this patent is extended or adjusted under 35 U.S.C. 154(b) by 53 days.

(21) Appl. No.: 11/177,853

(22) Filed: Jul. 8, 2005

Related U.S. Application Data

(60) Provisional application No. 60/587,018, filed on Jul. 8, 2004.

(51) Int. Cl.
*H03L 5/00* (2006.01)

(52) U.S. Cl. .......................................... 327/333; 326/81

(58) Field of Classification Search ................ 327/328, 327/333; 326/62, 68, 80–81
See application file for complete search history.

(56) References Cited

U.S. PATENT DOCUMENTS

| | | | |
|---|---|---|---|
| 6,288,591 B1 | 9/2001 | Riccio | |
| 6,373,315 B2 * | 4/2002 | Tsuji et al. | 327/333 |
| 6,700,429 B2 * | 3/2004 | Kanno et al. | 327/333 |
| 7,026,855 B2 * | 4/2006 | Sueoka et al. | 327/333 |
| 2003/0117207 A1 | 6/2003 | Suk et al. | |
| 2003/0222701 A1 | 12/2003 | Yang et al. | |
| 2005/0237099 A1 * | 10/2005 | Tachibana et al. | 327/333 |
| 2005/0285658 A1 * | 12/2005 | Schulmeyer et al. | 327/333 |

* cited by examiner

*Primary Examiner*—My-Trang Nu Ton
(74) *Attorney, Agent, or Firm*—Knobbe Martens Olson & Bear LLP

(57) ABSTRACT

A level shifting circuit with a power monitor enable for mixed-voltage applications is described. The level shifter translates signals from a first power supply voltage domain to a second. The level shifter provides a known output state, rather than an undefined mid-rail state, when either of the power supplies for the voltage domains is not adequately powered. In addition, the level shifter is IDDQ (quiescent current) compliant when static, drawing negligible current from the power supply. The level shifter can be used with a power monitor circuit, which controls the level shifter during power-up with an enable signal.

16 Claims, 9 Drawing Sheets

SYSTEMS AND METHODS FOR TRANSLATION OF SIGNAL LEVELS ACROSS VOLTAGE DOMAINS

CROSS-REFERENCE TO RELATED APPLICATION

This application claims the benefit under 35 U.S.C. § 119(e) of U.S. Provisional Application No. 60/587,018, filed Jul. 8, 2004, the entirety of which is hereby incorporated by reference.

BACKGROUND

1. Field of the Invention

The invention generally relates to integrated circuits that use multiple voltage biases, and in particular, to interface circuitry for translating signals from one voltage domain to another.

2. Description of the Related Art

Many integrated circuits or "chips" employ multiple power supplies or biases. For example, a digital core of a chip may operate from a 1.2V supply, while a low-voltage differential signaling (LVDS) transmitter in an input/output (I/O) portion of the chip may operate from a 3.3V supply. Terms that have been used to describe these integrated circuits include "split-voltage" or "dual-voltage." This difference in voltage requires an interface to translate data and control signals between the two or more voltage domains. A level-shifter is used to raise signal levels from a lower voltage domain to a higher voltage domain or even between two independent domains with the same voltage potential. A level shifter circuit is typically not needed when traversing from a high voltage domain to a lower voltage domain One challenging aspect for a multiple-voltage integrated circuit is that the sequencing of the multiple power supplies or biases can be unpredictable. For example, a multiple-voltage integrated circuit can be used in a very wide variety of applications, and the sequencing of the power supplies can vary. For example, one power supply cannot be guaranteed to power-up before another. Typically, both power supplies are ramped up at approximately the same time. However, due to physical delays in the two sources, either supply could come up slightly before the other. This can temporarily cause a level-shifter circuit to generate an unknown or unintended output state. Passing this unknown value can be detrimental to intended circuit performance. In addition, relatively large on-chip currents can be drawn, potentially damaging the device, if the output of the level-shifter is mid-rail (i.e., between a low level and a high level) or if the level-shifter's unknown state causes contention down-stream. For example, in a complementary MOS (CMOS) circuit, a mid-rail input can result in mutual conduction from the complementary pairs of transistors, which results in relatively large on-chip currents.

Conventional level shifters draw relatively high currents from the supply during IDDQ (quiescent supply current) testing when one or more of the power supplies are ramping up relatively slowly and/or when the power supplies are started with relative delay. This can disadvantageously prevent the use of IDDQ compliance testing to uncover circuit faults in manufacturing. Even a relatively small static current can add up to a substantial amount of current when many level shifters are present in a device.

FIG. 1 illustrates a conventional level shifter. The digital signal is translated from input (IN) to output (OUT) from a first, typically lower voltage domain (VDDL) to a second, typically higher, voltage domain (VDDH). The non-inverting buffer 102 and the inverter 104 provide complementary drive signals as inputs to a first NMOS transistor 106 and a second NMOS transistor 108. The first NMOS transistor 106 and the second NMOS transistor 108 are coupled to a first PMOS transistor 110 and a second PMOS transistor 112.

A problem exists when the lower voltage source (VDDL) is not available, and the higher voltage source (VDDH) is ramping up slowly to its normal operating level. In this circumstance, the level shifter can generate a mid-rail voltage output, which can be damaging to circuits further downstream that are also powered by the higher voltage source (VDDH). When VDDL is not powered on, the outputs of the non-inverting buffer 102 and the inverter 104 are the same potential (low) such that the same potential is provided as inputs to both the first NMOS transistor 106 and the second NMOS transistor 108. This is contrary to the complementary drive that should be provided. For example, when the input to the second NMOS transistor 108 is low, the output (OUT) should be driven to VDDH by activation of the second PMOS transistor 112. However, because both the first NMOS transistor 106 and the second NMOS transistor 108 are off, and the gates of the PMOS transistors 110, 112 are not driven, the output (OUT) is typically not pulled to a valid logic level (full rail for a static condition). The output (OUT) typically floats "mid-rail" to within a threshold of VDDH, which can lead to harmful mutual conduction and excessive currents in downstream circuitry.

SUMMARY

A level shifting circuit with a power monitor enable for mixed-voltage applications is described. A level shifter translates signals from a first power supply voltage domain to a second power supply voltage domain. The level shifter provides a known output state, rather than a mid-rail state, when either of the power supplies is not adequately powered. In addition, the level shifter is IDDQ (quiescent current) compliant when static, drawing negligible current from the power supply. The level shifter can be used with a power monitor circuit, which controls the level shifter during power-up with an enable signal. The level shifter can be used in a broad variety of applications. For example, the level shifter can find application in I/O cells, where control signals as well as the input and output data is communicated between a low-voltage core and higher voltage I/O cells. The circuit can be embodied in a wide variety of circuits, including, but not limited to, processors, microprocessors, microcontrollers, digital signal processors, serializer/deserializers (SerDes), add/drop multiplexers, and the like.

One embodiment includes a circuit for voltage translation from a first voltage reference to a second voltage reference, the circuit comprising: an input coupled to a data input signal referenced to the first voltage reference; a switching circuit coupled to the second voltage reference for power, where the second voltage reference is independent of the first voltage reference, the switching circuit coupled to the input, the switching circuit configured to generate a data output signal referenced to the second voltage reference, where the data output signal changes with the data input signal when the switching circuit is enabled; and an enabling circuit coupled to the switching circuit for control of the switching circuit, the enabling circuit having an enable input referenced to the second voltage reference, where the enabling circuit is configured to be responsive to the enable input such that in an enabled state, the enabling circuit is configured to enable the switching circuit, and in a not enabled state, the enabling circuit is configured to set the data output signal to a predetermined level. For example, the first voltage reference can be 1.8 volts, and the second voltage reference can be 3.3 volts.

One embodiment is a method for translating a signal from a first voltage domain to a second voltage domain, where the method includes: receiving an input signal referenced to the first voltage domain; receiving an enable control signal, where the enable control signal has an enabled state and a disabled state; and generating an output signal referenced to the second voltage domain, where a voltage bias for the second voltage domain is independent from a voltage bias for the first voltage domain, where a logic state of the output signal changes with changes in a logic state of the input signal when the enable control signal is in the enabled state, and where the output signal has a predetermined logic state when the enable control signal is in the disabled state.

One embodiment is a circuit for translating a signal from a first voltage domain to a second voltage domain, where the circuit includes: means for receiving an input signal referenced to the first voltage domain; means for receiving an enable control signal, where the enable control signal has an enabled state and a disabled state; and means for generating an output signal referenced to the second voltage domain, where a voltage bias for the second voltage domain is independent from a voltage bias for the first voltage domain, where a logic state of the output signal changes with changes in a logic state of the input signal when the enable control signal is in the enabled state, and where the output signal has a predetermined logic state when the enable control signal is in the disabled state.

One embodiment is a method of enabling and disabling a level shifter, where the method includes: ramping up a first power supply used by the level shifter; ramping up a second power supply used by the level shifter; and disabling the level shifter when at least one of the first power supply or the second power supply is not at an operating level such that the level shifter generates a predetermined output level.

One embodiment is a power monitor circuit, where the power monitor circuit includes: a first NMOS transistor with a gate terminal, a drain terminal, and a source terminal, where the gate terminal is coupled to a first voltage reference, where the drain terminal is coupled to a first node, and where the source terminal is coupled to a third voltage reference; a first PMOS transistor with a gate terminal, a drain terminal, and a source terminal, where the gate terminal is coupled to a second node, where the drain terminal is coupled to the first node, and where the source terminal is coupled to a second voltage reference; a second PMOS transistor with a gate terminal, a drain terminal, and a source terminal, where the gate terminal is coupled to the first node, and where the source terminal is coupled to the second voltage reference; a third PMOS transistor with a gate terminal, a drain terminal, and a source terminal, where the gate terminal is coupled to the first voltage reference, where the drain terminal is coupled to the third voltage reference, and where the source terminal is coupled to the second node; and a voltage dropping circuit with an anode terminal and a cathode terminal, where the anode terminal is coupled to the drain of the second PMOS transistor, and where the cathode terminal is coupled to the second node.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

A level-shifter circuit and a power monitor circuit are described. The level-shifter circuit includes an enable control input, which can be used to set the level-shifter circuit at a predetermined state. This can be used to avoid an undefined state, such as a "mid-rail" condition, which can damage devices further downstream of the level-shifter circuit. The presence of such "mid-rail" output conditions plague conventional level-shifter circuits when the lower voltage supply (VDDL) is not available or not fully available, and the higher voltage supply (VDDH) is available. The power monitor circuit controls the enable control input of the level-shifter circuit. In one embodiment, the power monitor circuit is compliant the with quiescent current (IDDQ) testing requirements with a relatively small area.

While generally described as a "level shifter" in the context of an integrated circuit using two or more voltage biases with at least a lower bias supply (VDDL) and a higher voltage supply (VDDH), these level shifter circuits can also be used where the voltage biases (VDDL and VDDH) are nominally the same voltage potential and it is desirable to isolate the voltage biases. Accordingly, when the independent voltage biases operate at the same voltage potential, the voltage level of the signal passing through the level shifter may not change.

Figure 1:
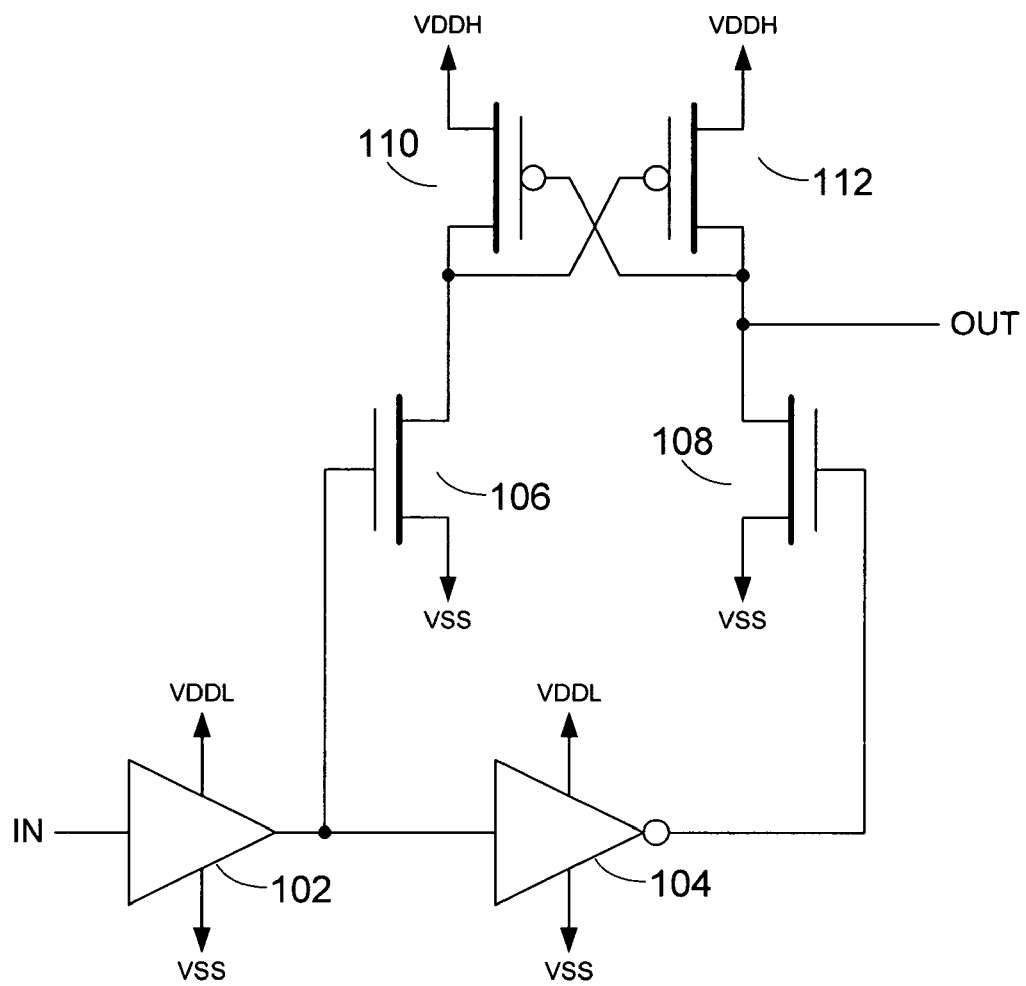
FIG. 1 illustrates a conventional level shifter.
Figure 2A:
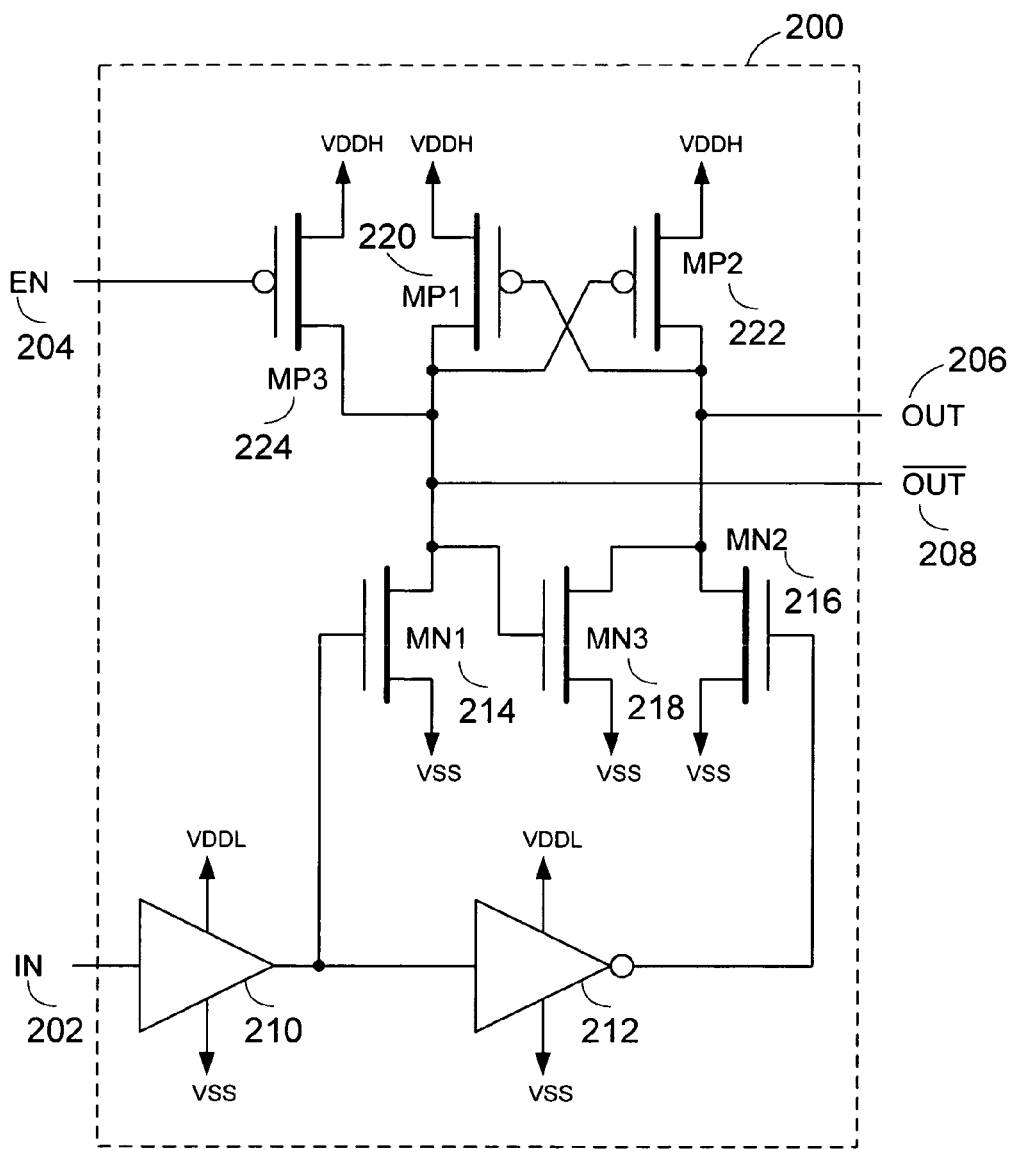
FIG. 2A illustrates a level shifter according to an embodiment of the invention.
Figure 6A:
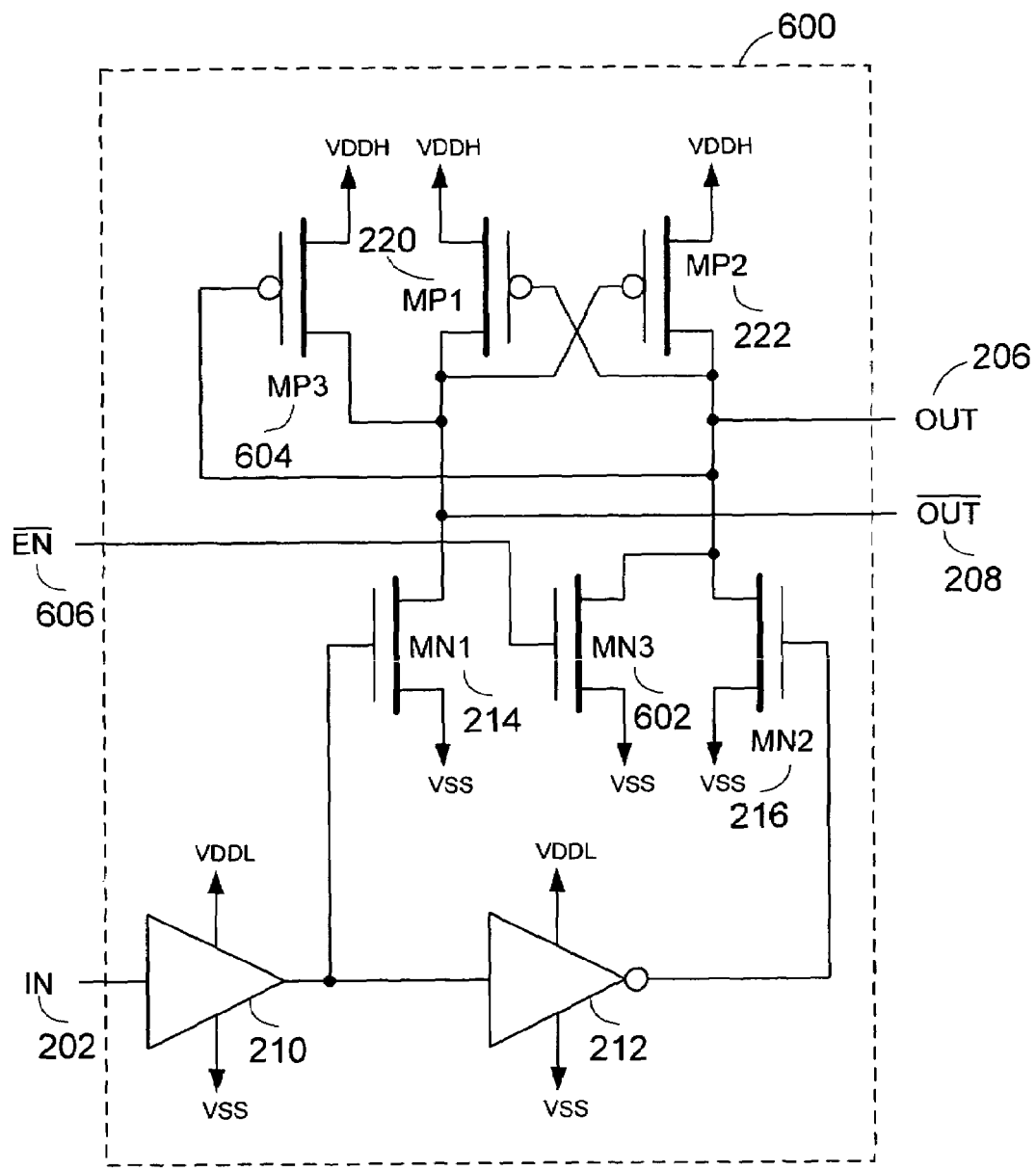
FIGS. 6A and 6B illustrate level shifters with an active low enable.
Figure 6B:
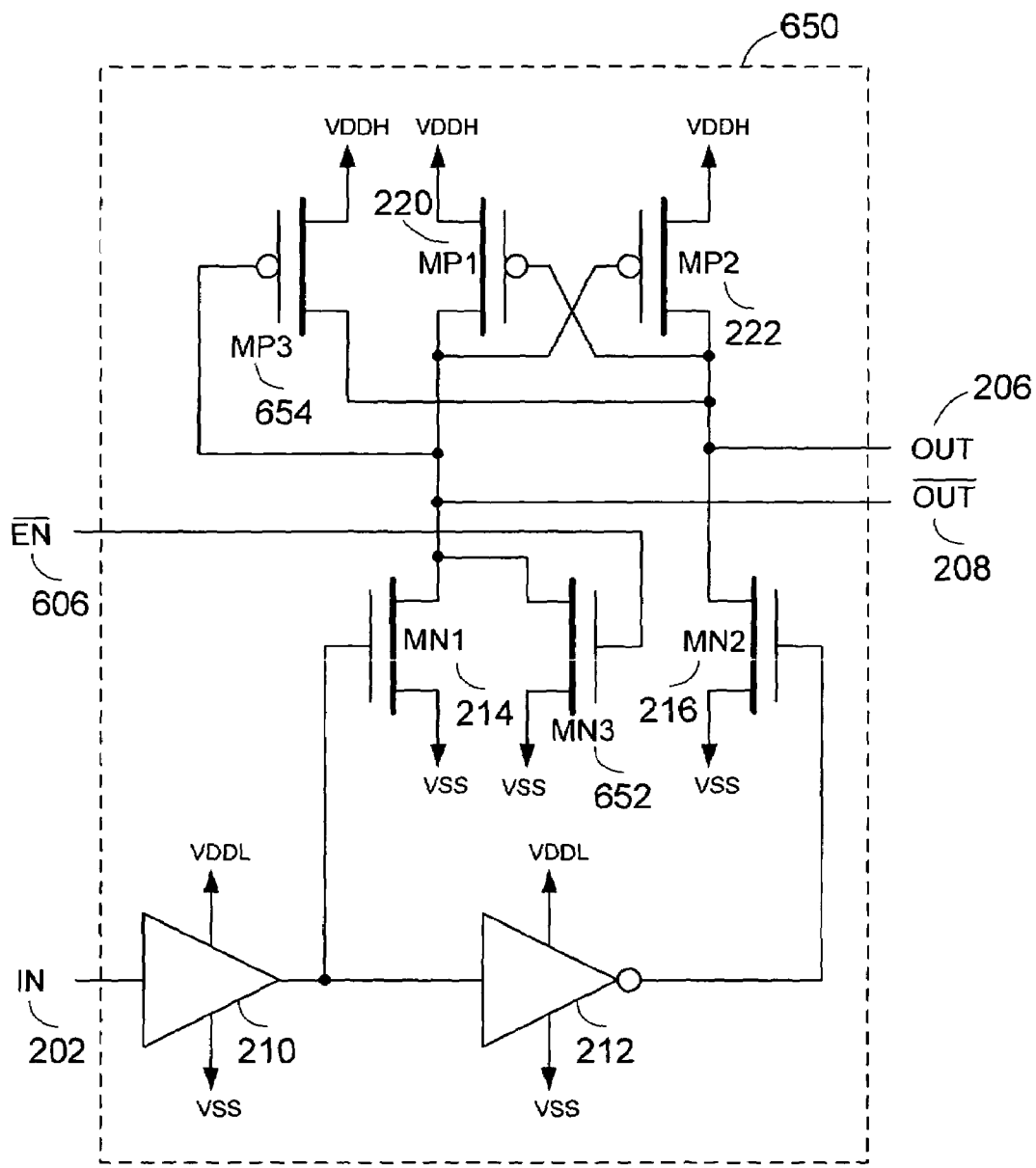

FIG. 2A illustrates a level shifter 200 according to an embodiment of the invention. The level shifter 200 includes an input (IN) 202 and an enable control (EN) 204 for control, and also includes an output (OUT) 206. In the embodiment illustrated in FIG. 2A, when the level shifter 200 is not enabled, i.e., the enable control (EN) 204 is not asserted or is "low," the level shifter 200 generates a "low" on the output (OUT) 206. In another embodiment, which will be described in greater detail later in connection with FIG. 2B, a level shifter 250 generates a "high" on the output when the level shifter 250 is not enabled. Of course, an active-low enable can also be used as illustrated in FIGS. 6A and 6B.

Figure 2B:
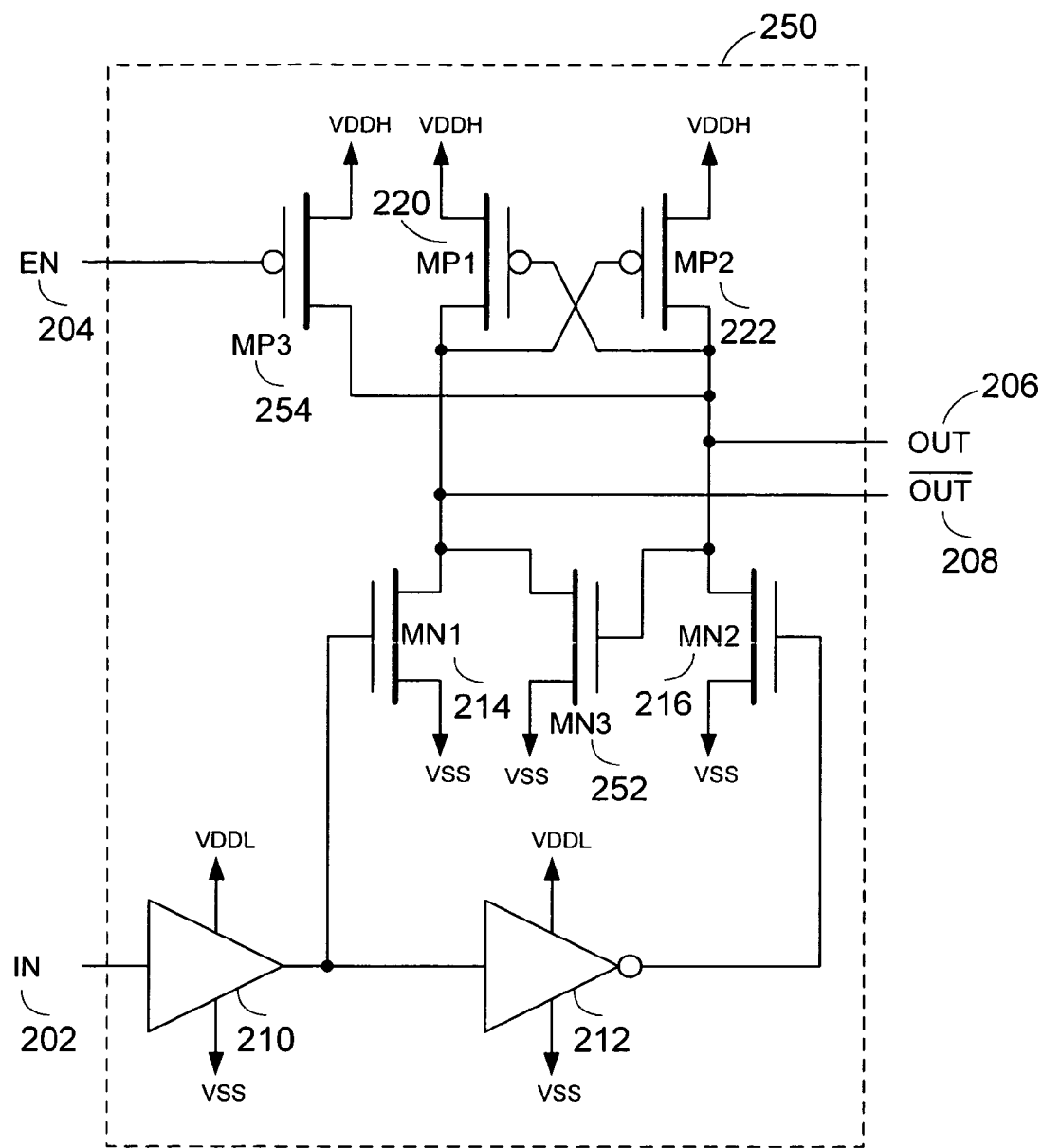
FIG. 2B illustrates a level shifter according to an embodiment of the invention.

While the level shifters 200, 250 in FIGS. 2A and 2B are generally described in the context of a non-inverting level shifter, the inverted output state ($\overline{OUT}$) is also available in the level shifter, and the principles and advantages described herein apply to both non-inverting and inverting level shifter circuits.

Advantageously, the setting of the output (OUT) 206 to a pre-determined state, whether high or low, via the enable control (EN) 204 prevents the output from generating a "mid-rail" voltage level, which can be harmful when applied as an input to a downstream device. The illustrated level shifter 200 includes a non-inverting buffer 210, an inverting buffer or inverter 212, NMOS transistors MN1 214, MN2 216, MN3 218, and PMOS transistors MP1 220, MP2 222, MP3 224. In one embodiment, the non-inverting buffer 210 and the inverter 212 are simple buffers and inverters, e.g., the inverter 212 can be a CMOS pair. The non-inverting buffer 210 can also be an output stage of a circuit upstream of the level shifter 200. In addition, where differential signals are used, both the non-inverting buffer 210 and the inverter 212 can be part of a circuit upstream of the level shifter 200.

The input (IN) 202 is the input of the non-inverting buffer 210. The output of the non-inverting buffer 210 follows the input (IN) 202. The level shifter 200 is typically implemented in an integrated circuit, and the non-inverting buffer 210 can be part of a circuit upstream of the level shifter 200 and can be optional. The output of the non-inverting buffer 210 is provided as an input to the inverter 212 and to a gate terminal of the NMOS transistor MN1 214. The non-inverting buffer 210 and the inverter 212 are coupled to VSS and to VDDL for power. The output of the inverter 212 is provided as an input to the gate terminal of the NMOS transistor MN2 216. Source terminals of NMOS transistors MN1 214, MN2 216, and MN3 218 are coupled to VSS. In one embodiment, VSS is ground. The drain terminal of the NMOS transistor MN1 is coupled to the drain terminal of the PMOS transistor MP3 224, the drain terminal of the PMOS transistor MP1 220, the gate terminal of the PMOS transistor MP2 222, and to the gate terminal of the NMOS transistor MN3 218. The gate terminal of the PMOS transistor MP3 224 is coupled to the enable control (EN) 204. The source terminals of the PMOS transistors MP1 220, MP2 222, and MP3 224 are coupled to the higher voltage source VDDH. The drain terminal of the NMOS transistor MN2 216 is coupled to the drain terminal of the NMOS transistor MN3 218, to the gate terminal of the PMOS transistor MP1 220, to the drain terminal of the PMOS transistor MP2 222, and to the output (OUT) 206.

The level shifter 200 can be exposed to a variety of conditions. For example, the higher voltage source (VDDH) and the lower voltage source (VDDL) can have the following conditions: (i) both VDDH and VDDL off; (ii) both VDDH and VDDL on; (iii) VDDH off and VDDL on; and (iv) VDDH on and VDDL off. For the purposes of discussion, the "off" state for a power supply voltage includes when the power supply voltage is less than the operational voltage (such as while ramping up) or "partially on." It should be noted that a very wide range of voltages can apply to the higher voltage source (VDDH) and the lower voltage source (VDDL). Examples of normal "on" levels include 3.3 volts for VDDH, 1.8 volts for VDDL, and 0 volts for VSS. In another example, VDDL is 1.2 volts.

The conditions labeled (i), (ii), and (iii) are typically not harmful to an integrated circuit. When both VDDH and VDDL are off as described for condition (i), both voltage domains are off and there is no "mid-rail" output state. When both VDDH and VDDL are on as described for condition (ii), the level shifter 200 is properly biased, and the level shifter 200 provides a normal output state (OUT) that follows the input state (IN). Of course, the level shifter 200 can also provide the inverse ($\overline{OUT}$) of the input state (IN). A description of the circuit operation for condition (ii) will follow. When VDDH is completely off (0 volts) and VDDL is on as described for condition (iii), the non-inverting buffer 210 and the inverter 212 are biased for control of transistors MN1 214 and MN2 216, and the output (OUT) 206 will typically correspond to 0V as there is no source of positive voltage for the output transistor, e.g., MP1 220 or MP2 222 as applicable.

When VDDH is partially on (considered off or not available), the output (OUT) 206 is at the predetermined voltage when the enable control (EN) 204 is not activated, and will correspond to the partially on VDDH level or to VSS if the enable control (EN) 204 is activated, depending on the state received at the input (IN) 202. This is typically not harmful to the downstream circuits as the partially-on VDDH is also biasing the downstream circuits and is not "mid-rail."

A potentially damaging condition exists in the art for condition (iv), with VDDH on and VDDL off. The techniques disclosed herein ameliorate the potentially damaging effects of condition (iv), and will be discussed in greater detail following a description of the normal operation of condition (ii). The described techniques for condition (iv) are also useful when VDDH and VDDL should be at the same voltage potential, but are biased from different power supplies so that the turn-on sequencing of the biasing will be unpredictable or unknown. For the sake of clarity, the circuit operation will be described with reference to relatively slowly changing signals. It will be understood that signals do not actually transition instantaneously.

When VDDH and VDDL are both on, the power monitor circuit driving the enable control (EN) 204 should assert a high to enable the level shifter 200. With a high on the enable control (EN) 204, the PMOS transistor MP3 224 is off or non-conductive and does not affect the state of the output (OUT) 206 of the level shifter 200. When the input (IN) 202 is low, the output of the non-inverting buffer 210 is low, and the output of the inverter 212 is high. The low on the output of the non-inverting buffer 210 turns off the NMOS transistor MN1 214. The high on the output of the inverter 212 turns on the NMOS transistor MN2 216. The activation of the NMOS transistor MN2 216 pulls the output (OUT) 206 down to VSS.

When the NMOS transistor MN2 216 is activated, the drain terminal of the PMOS transistor also pulls down the gate terminal of the PMOS transistor MP1 220 to VSS, which turns on the PMOS transistor MP1 220. Activation of the PMOS transistor MP1 220 places a high or VDDH on the drain terminal of the PMOS transistor MP1 220, which is cross-coupled to the gate terminal of the PMOS transistor MP2 222, and turns the PMOS transistor MP2 222 off. The VDDH from the drain terminal of the PMOS transistor MP1 220 is also coupled to drains of the PMOS transistor MP3 224 and the NMOS transistor MN1 214, both of which are off. The VDDH from the drain terminal of the PMOS transistor MP1 220 is further coupled to the gate terminal of the NMOS transistor MN3 218, which turns on the NMOS transistor MN3 218, further pulling the output (OUT) 206 low to VSS.

When the input (IN) 202 is high, the output of the non-inverting buffer 210 is high, and the output of the inverter 212 is low. The low on the output of the inverter 212 is provided to the gate terminal of the NMOS transistor MN2 216, which turns off the NMOS transistor MN2 216. The high on the output of the non-inverting buffer 210 is provided to the gate terminal of the NMOS transistor MN1 214, which turns on the NMOS transistor MN1 214 so that the drain is pulled down to VSS. This turns off the NMOS transistor MN3 218, turns on the PMOS transistor MP2 222, and pulls the drain terminal of the already-off PMOS transistor MP3 224 low. With the PMOS transistor MP2 222 on, the drain terminal of the PMOS transistor MP2 222 provides VDDH to the output (OUT) 206. In addition, the VDDH from the drain terminal of the PMOS transistor MP2 222 is cross-coupled to the gate terminal of the PMOS transistor MP1 220 and shuts off the same. An inverted output ($\overline{\text{OUT}}$) 208 is also available by coupling to a node common to the drains of the NMOS transistor MN1 214 and the PMOS transistor MP1 220 (among others) as illustrated in FIG. 2A.

In condition (iv), when VDDL is not on, but VDDH is on, the enable control (EN) 204 should be deactivated or low. After VDDL is powered on or is high enough, the enable control (EN) 204 should be activated or high for normal operation. With the enable control (EN) 204 low, such as at VSS, the PMOS transistor MP3 224 is on, and VDDH is provided at the drain terminal of the PMOS transistor MP3 224. This turns on the NMOS transistor MN3 218 to provide a low or VSS on the output (OUT) 206. The VDDH on the drain terminal of the PMOS transistor MP3 224 also turns off the PMOS transistor MP2 222. This advantageously places the level shifter 200 in a predetermined state, as opposed to a "mid-rail" state, which makes the output OUT (206) of the level shifter 200 safer for downstream circuits. In the embodiment illustrated in FIG. 2A, the predetermined state is low or pulled down to VSS for the output (OUT) 206 or is high or pulled up to VDDH for the inverted output ($\overline{\text{OUT}}$) 208.

The predetermined state can also be high for the output (OUT) 206 or low for the inverted output ($\overline{\text{OUT}}$) 208. Such a configuration is illustrated in FIG. 2B. When the enable control (EN) 204 is pulled high by a power monitor circuit, the PMOS transistor MP3 254 is off, and the output (OUT) 206 of the level shifter 250 follows the input (IN) 202. When the enable control (EN) 204 is pulled low, the PMOS transistor MP3 254 is on and provides VDDH to the node with the output (OUT) 206. The drain terminal of the PMOS transistor MP3 254 is also coupled to the gate terminal of the PMOS transistor MP1 220 and to the gate terminal of the NMOS transistor MN3 252. With the PMOS transistor MP3 254 on, this turns off the PMOS transistor MP1 220 and turns on the NMOS transistor MN3 252.

With the NMOS transistor MN3 252 on, the gate terminal of the PMOS transistor MP2 222 is pulled low to VSS. This turns on the PMOS transistor MP2 222 such that VDDH is coupled to the output (OUT) 206.

In the illustrated embodiment, the high level and low level drive for the output (OUT) 206 is provided by the NMOS transistor MN2 216 and the PMOS transistor MP2 222. Accordingly, the NMOS transistor MN3 218 of FIG. 2A and the PMOS transistor MP3 254 of FIG. 2B can be relatively small geometry to save space and cost. The PMOS transistor MP3 224 of FIG. 2A and the NMOS transistor MN3 252 of FIG. 2B can also be relatively small, such as of minimum geometry for the integrated circuit.

Figure 3:
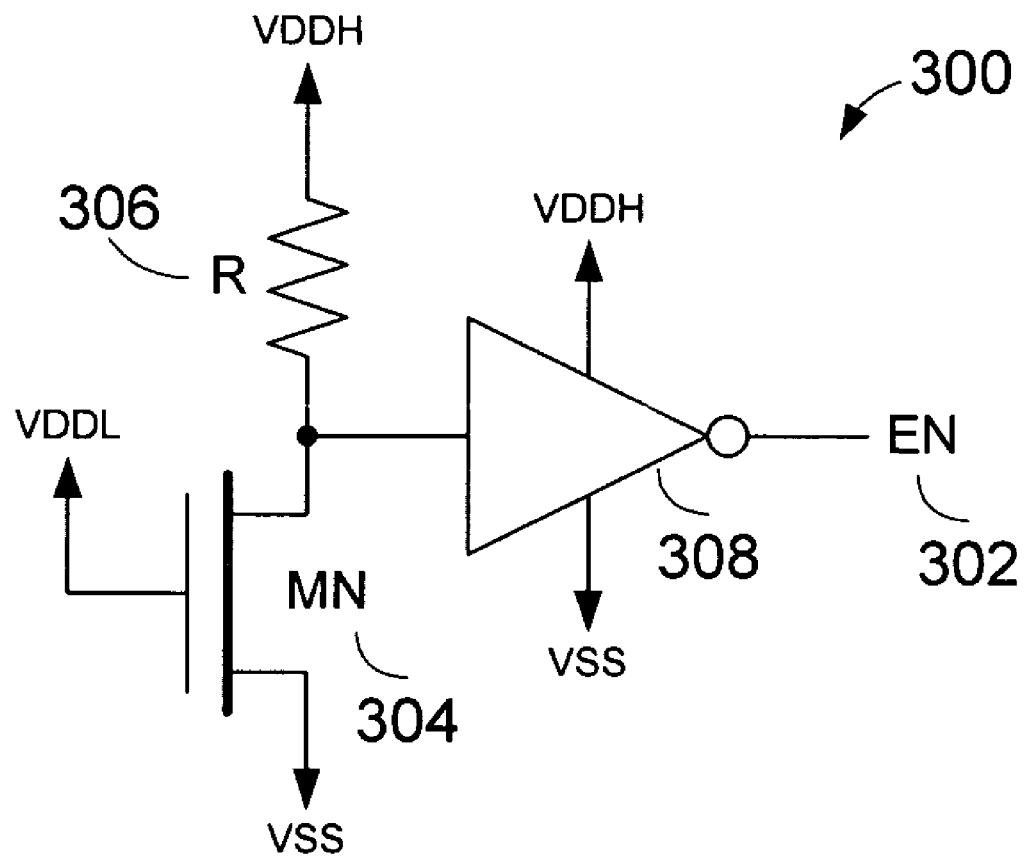
FIG. 3 illustrates a power monitor circuit that can generate an enable control signal.

FIG. 3 illustrates one embodiment of a power monitor 300 that generates an enable output 302 that can be used to control the enable control (EN) 204. The power monitor 300 provides a VDDH high on the enable output 302 when both the VDDH and VDDL biases are up, and provides a low on the enable output 302 when the VDDL bias is not sufficiently up. When the VDDH bias is low, the enable output 302 will typically be low as well. The typically damaging condition for a multiple voltage bias circuit occurs when the lower voltage bias VDDL is not available and the higher voltage bias VDDH is available. The level shifters and power monitors are also applicable where the VDDL and the VDDH are the same electrical potential, but from different biases so that the biases are not guaranteed to turn on at the same time. For example, level shifter circuits are used in these applications to reduce the noise coupling from the different domains. For example, an I/O domain may be noisier than a domain for the core, and isolation is desirable.

The illustrated power monitor 300 includes an NMOS transistor MN 304, a resistor R 306, and an inverter 308. The gate, source, and drain terminal of the NMOS transistor MN 304 are coupled to the lower voltage bias VDDL, VSS, and to a terminal of the resistor R 306, respectively. The other terminal of the resistor R 306 is coupled to the higher voltage bias VDDH. The input of the inverter 308 is coupled to the drain terminal of the NMOS transistor MN 304, and the output of the inverter 308 provides the enable output 302. The inverter 308 is biased from the higher voltage VDDH.

When the higher voltage bias VDDH is on and the lower voltage bias VDDL is low or at least below the threshold voltage $V_{TH}$ of the NMOS transistor MN 304, the NMOS transistor MN 304 is off or non-conducting, and the resistor R 306 pulls the input of the inverter 308 to VDDH. The enable output 302 of the inverter 308 is then low, which disables the level shifters downstream of the power monitor 300.

When the higher voltage bias VDDH is on and the lower voltage bias VDDL is also on, the NMOS transistor MN 304 is on, and the input of the inverter 308 is low or approximately at VSS. The enable output 302 of the inverter 308 is correspondingly high to enable the level shifters downstream of the power monitor 300.

Figure 4A:
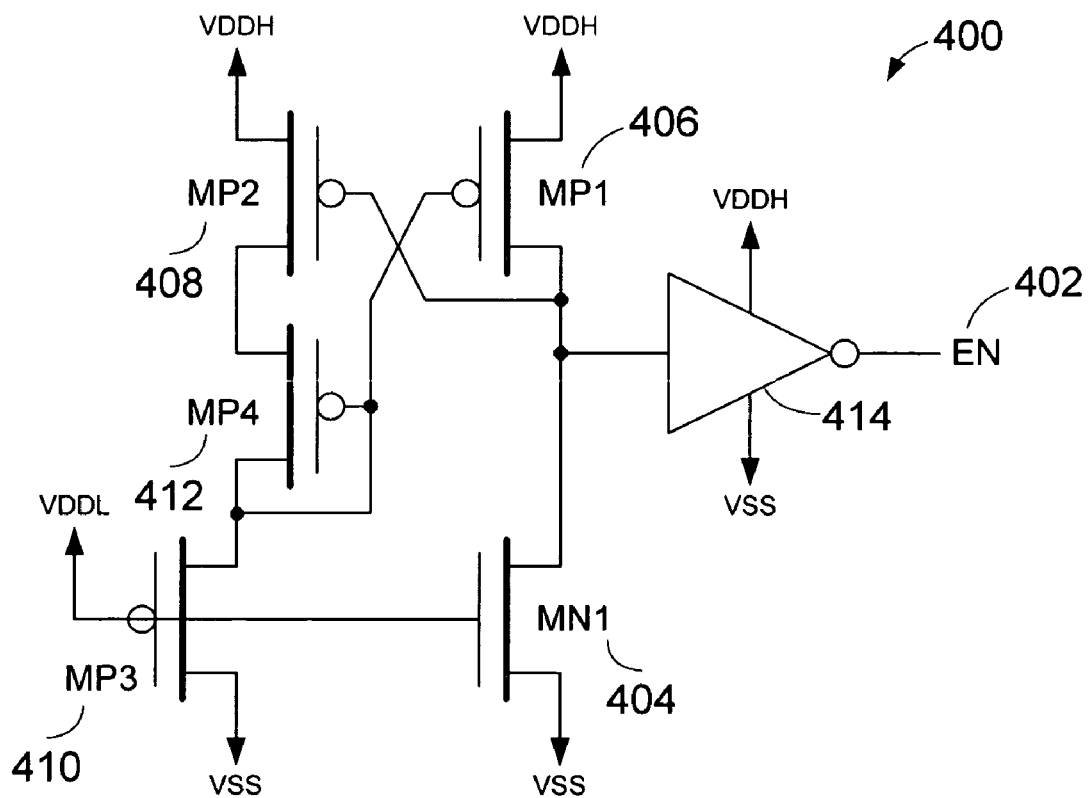
FIG. 4A illustrates a power monitor circuit according to an embodiment of the invention that can generate an enable control signal.
Figure 4B:
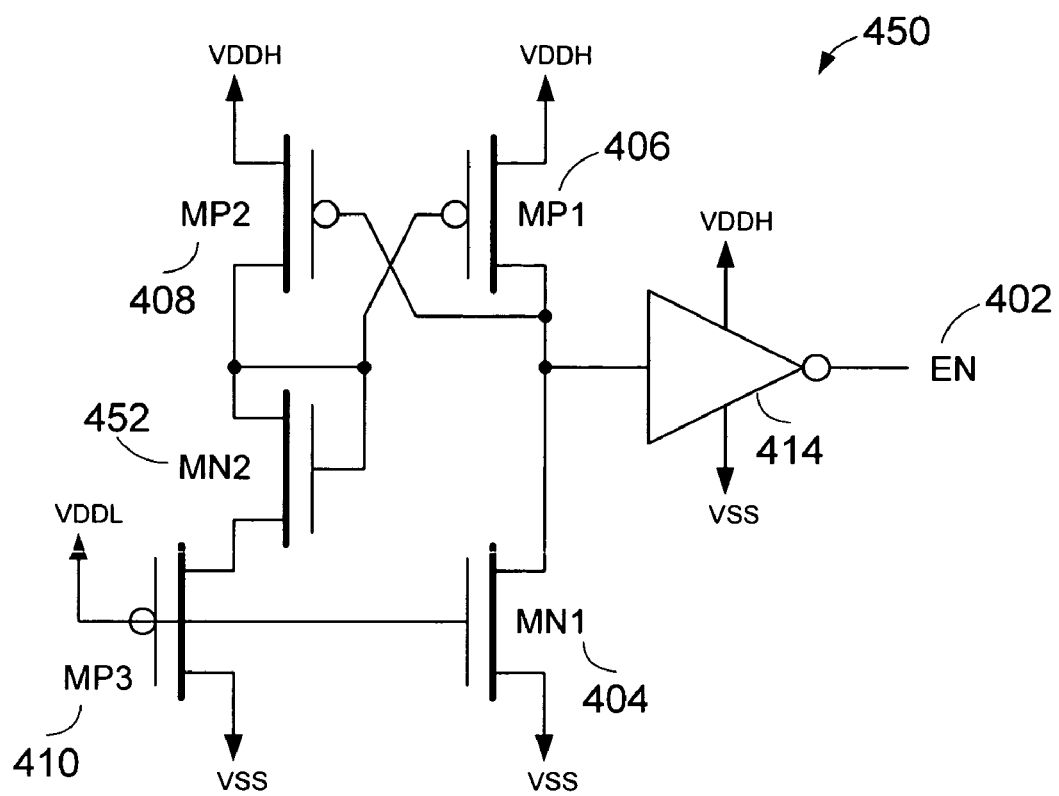
FIG. 4B illustrates a power monitor circuit according to an embodiment of the invention that can generate an enable control signal.

FIGS. 4A and 4B illustrate examples of power monitor circuits 400, 450 with an all-active device architecture, which in turn lowers an amount of chip area used and decreases production cost. In addition, the illustrated power monitor circuits 400, 450 use virtually no quiescent current, thereby permitting IDDQ (quiescent supply current) compliance testing to be used when testing the device. The enable output 402 of the power monitor circuits 400, 450 should generate a VDDH high level when the lower voltage bias VDDL and the higher voltage bias VDDH are both on, and should generate a low level when the lower voltage bias VDDL is off and the higher voltage is on. In addition to use as a control for a level shifter, the power monitor circuits 400, 450 can also be used for control of other circuits, as a status monitor, and the like.

For example, the power monitor circuits 400, 450 can be used in analog circuits where a continuum of voltages may be present. The power monitor circuits 400, 450 can be used to detect for the presence of a lower voltage (e.g., VDDL) than a power supply bias (e.g., VDDH) and conveniently translate the detection to a binary signal switching from VSS to VDDH. For example, a power monitor circuit can be used with an analog circuit having a start-up sensor to protect against illegal start-up states that can occur upon power-supply ramping. Control signals from the power monitor circuit can be used to initiate recovery circuitry.

The power monitor circuit 400 of FIG. 4A includes an NMOS transistor MN1 404, a PMOS transistor MP1 406, a PMOS transistor MP2 408, a PMOS transistor MP3 410, and a voltage drop circuit. In the illustrated embodiment, the voltage drop circuit is implemented with a diode-connected PMOS transistor MP4 412. Other circuits to implement a voltage drop in a semiconductor assembly will be readily determined by one of ordinary skill in the art. For example, one or more PN junctions can be used for a voltage drop. The power monitor circuit 400 also includes an inverter 414. In one embodiment, the inverter 414 is a complementary MOS sub-circuit of a PMOS transistor and an NMOS transistor.

The lower voltage bias VDDL is coupled to gate terminals of the NMOS transistor MN1 404 and the PMOS transistor MP3 410. The source terminal of the NMOS transistor MN1 404 and the drain terminals of the PMOS transistor MP3 410 are coupled to VSS, which can be ground. The drain terminal of the NMOS transistor MN1 404 is coupled to an input of the inverter 414, a drain terminal of the PMOS transistor MP1 406, and to a gate terminal of the PMOS transistor MP2 408. The source terminals of the PMOS transistor MP1 406 and the PMOS transistor MP2 408 are coupled to the higher voltage bias VDDH. The drain terminal of the PMOS transistor MP2 408 is coupled to a more positive voltage end or anode of a voltage drop.

In the illustrated embodiment, the voltage drop is provided by the PMOS transistor MP4 412. The gate and the drain terminals of the PMOS transistor MP4 412 are connected or in a "diode configuration." The source terminal of the PMOS transistor MP4 412 is coupled to the drain terminal of the PMOS transistor MP2 408 and forms the anode of the voltage drop. The gate and drain terminals form the cathode or more negative voltage end of the voltage drop. The gate and drain terminals of the PMOS transistor MP4 412 are coupled to the gate terminal of the PMOS transistor MP1 406 and to a source terminal of the PMOS transistor MP3 410.

In one embodiment, the voltage drop across the diode-connected PMOS transistor MP4 412 is approximately the threshold voltage $V_{TH}$. The voltage is dropped from the source terminal to the connected gate and drain terminals.

The operation of the power monitor circuit 400 will now be described with both the lower voltage bias VDDL and the higher voltage bias VDDH available. The lower voltage bias VDDL is coupled to the NMOS transistor MN1 404. With the lower voltage bias VDDL powered on, the NMOS transistor MN1 404 is on such that the input of the inverter 414 is low. With the input of the inverter 414 pulled low or to VSS, the enable output 402 of the inverter 414 is a VDDH high, which enables the corresponding level shifters.

With the drain terminal of the NMOS transistor MN1 404 pulled low to VSS, the gate terminal of the PMOS transistor MP2 408 is also pulled low, thereby turning on the PMOS transistor MP2 408. This places VDDH on the drain terminal of the PMOS transistor MP2 408. A portion of the VDDH from the drain terminal is dropped across the voltage drop, which is implemented in the illustrated embodiment by the PMOS transistor MP4 412. The amount of voltage dropped across the voltage drop depends on the number of devices and the geometry of the same used to implement the voltage drop. In the illustrated example, only one transistor is used, but for larger voltage differences between VDDH and VDDL, two or more transistors can be arranged in series for larger voltage drops. For example, where one transistor is used for the voltage drop, the voltage drop can be the threshold voltage $V_{TH}$, which can be around one volt. The purpose of the voltage drop is to lower the voltage at the source terminal of the PMOS transistor MP3 410. The voltage drop provided by the PMOS transistor MP3 410 lowers the voltage at the source terminal of the PMOS transistor MP3 410, and prevents the PMOS transistor MP3 410 from turning on with a high VDDL (which is lower than VDDH). By keeping the PMOS transistor MP3 410 from turning on, the gate terminal of the PMOS transistor MP1 406 is relatively high so that the PMOS transistor MP1 406 is substantially off.

When the lower voltage bias VDDL is low or not available and the higher voltage bias VDDH is on, the PMOS transistor MP3 410 is on and the NMOS transistor MN1 404 is off. The activation of the PMOS transistor MP3 410 pulls the source terminal of the PMOS transistor MP3 410 relatively low, such as about a threshold above the gate voltage of the PMOS transistor MP3 410. For example, where VDDL is down to VSS, the voltage at the source terminal of the PMOS transistor MP3 410 should be about the threshold $V_{TH}$ for the PMOS transistor MP3 410.

The source terminal of the PMOS transistor MP3 410 is coupled to the gate terminal of the PMOS transistor MP1 406, which turns on with the low gate voltage. With the PMOS transistor MP1 406 on, a high level is provided as an input to the inverter 414, which in turn generates a low on the enable output 402. This is used by the level shifter circuits to safely set the level shift output to a predetermined voltage, rather than risk a dangerous mid-rail voltage.

The VDDH high level on the drain terminal of the PMOS transistor MP1 406 is coupled to the gate terminal of the PMOS transistor MP2 408, and shuts off the PMOS transistor MP2 408. Since the PMOS transistor MP2 408 is off, the PMOS transistor MP3 410 is on, the voltage drop function of the PMOS transistor MP4 412 is not used for this condition.

FIG. 4B illustrates another embodiment of a power monitor 450. In the power monitor 450 of FIG. 4B, the voltage drop is implemented by a gate-drain connected or "diode connected" NMOS transistor MN2 452. The connected gate and drain terminals form the anode of the voltage drop. The source terminal forms the cathode of the voltage drop. As described earlier in connection with FIG. 4A, the voltage drop can be increased by using combinations of gate-drain connected transistors in series. These series combinations can be made from PMOS transistors, NMOS transistors, or both.

Figure 5:
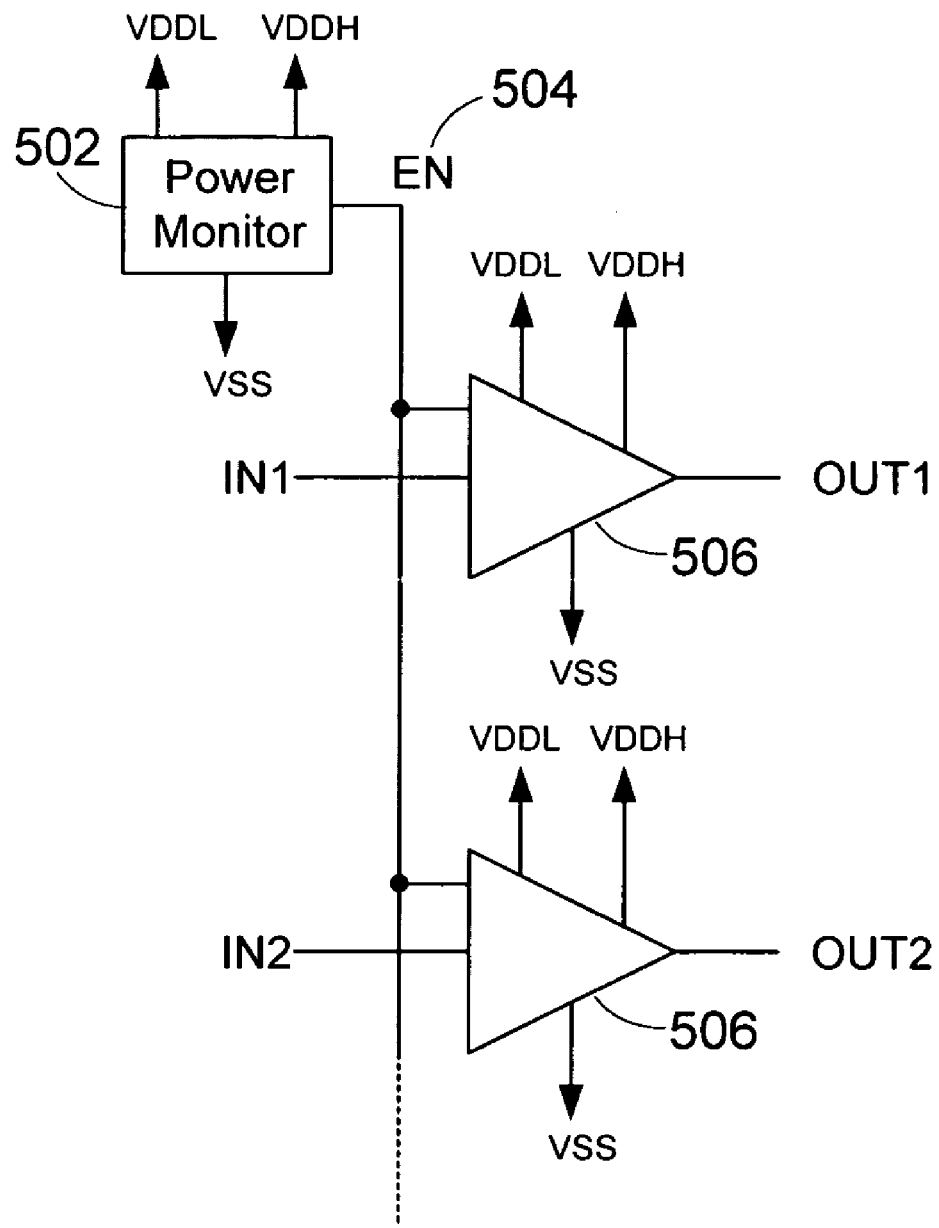
FIG. 5 illustrates sharing the enable control signal of a power monitor circuit among multiple level shifters.

FIG. 5 illustrates a power monitor 502 providing an enable control signal 504 to one or more level shifters 506. A very large number of level shifters 506 can be controlled by a single power monitor 502. The level shifters 506 sharing a power monitor should, of course, be powered by a lower voltage bias VDDL and higher voltage bias VDDH common with the level shifters 506 and the power monitor 502. The power monitor 502 should generate an enable or VDDH high when both the lower voltage bias VDDL and the higher voltage bias VDDH are on, and the power monitor 502 should generate a low at least when the lower voltage bias VDDL is low or not available. The principles and advantages of the power monitor and level shifters are also applicable to circuits that have multiple voltage domains of the same voltage potential but from separate biases. In these situations, the separate biases can still come up unpredictably, which can lead to mid-rail voltage levels, which can damage devices. The power monitors described earlier in connection with FIGS. 3, 4A, and 4B can be used for the power monitor 502 of FIG. 5. Other configurations of power monitor circuits will be readily determined by one of ordinary skill in the art. The level shifter circuits described earlier in connection with FIGS. 2A and 2B can be used for the level shifter circuits 506.

The power monitor circuits 400, 450 illustrated in FIGS. 4A and 4B generate active high enable signals. In one embodiment, another inverter stage following the inverter 414 is used to generate an active low enable. In another embodiment, the node joining the drain of the NMOS transistor MN1 404, the drain of the PMOS transistor MP1 406, and the gate of the PMOS transistor MP2 408 is used as a source for an active low enable.

FIGS. 6A and 6B illustrate level shifter circuits 600, 650 that are active-low enabled versions of the level shifter circuits 200, 250 described earlier in connection with FIGS. 2A and 2B, respectively. As illustrated in both FIGS. 6A and 6B, the connections for the N-channel transistors MN3 602 for FIG. 6A and MN3 652 for FIG. 6B and the connections for the P-channel transistor MP3 604 for FIG. 6A and MP3 654 for FIG. 6B have been changed. The active low enable (EN) 606 is coupled to the gate terminal of the N-channel transistor MN3 602 or to the N-channel transistor MN3 652. When the active low enable (EN) 606 is high, the level shifter circuits 600, 650 generate a predetermined level for an output. When the active low enable (EN) 606 is low, the level shifter output (OUT 206 and/or OUT 208) can change with the input 202.

Various embodiments of the invention have been described above. Although this invention has been described with reference to these specific embodiments, the descriptions are intended to be illustrative of the invention and are not intended to be limiting. Various modifications and applications may occur to those skilled in the art without departing from the true spirit and scope of the invention.

What is claimed is:

1. A circuit for voltage translation from a first voltage reference to a second voltage reference, the circuit comprising:
   an input coupled to a data input signal that is referenced to the first voltage reference;
   a switching circuit coupled to the second voltage reference for power, where the second voltage reference is independent of the first voltage reference, the switching circuit coupled to the input, the switching circuit configured to generate a data output signal referenced to the second voltage reference, where the data output signal changes with the data input signal when the switching circuit is enabled; and
   an enabling circuit coupled to the switching circuit for control of the switching circuit, the enabling circuit having an enable input referenced to the second voltage reference, where the enabling circuit is configured to be responsive to the enable input such that in an enabled state, the enabling circuit is configured to enable the switching circuit, and in a not enabled state, the enabling circuit is configured to set the data output signal to a predetermined level, wherein the enabling circuit further comprises:
   a PMOS transistor with a gate terminal, a drain terminal, and a source terminal, where the gate terminal is coupled to the enable input, where the drain terminal is coupled to a first portion of the switching circuit, and where the source terminal is coupled to the second voltage reference; and
   an NMOS transistor with a gate terminal, a drain terminal, and a source terminal, where the gate terminal of the NMOS transistor is coupled to the drain terminal of the PMOS transistor, where the drain terminal of the NMOS transistor is coupled to a second portion of the switching circuit different from the first portion, and where the source terminal of the NMOS transistor is coupled to a third voltage reference.

2. The circuit as defined in claim 1, wherein the predetermined level is a ground reference for the second voltage reference.

3. The circuit as defined in claim 1, wherein the predetermined level is a voltage potential of the second voltage reference.

4. The circuit as defined in claim 1, where the third voltage reference is ground.

5. A circuit for voltage translation from a first voltage reference to a second voltage reference, the circuit comprising:
   an input coupled to a data input signal that is referenced to the first voltage reference, wherein the input further comprises an input circuit, the input circuit comprising an inverter coupled, directly or indirectly, to the input data input signal as an input, the inverter configured to generate an output that is an inverse of the data input signal, where the output of the inverter is referenced to the first voltage reference;
   a switching circuit coupled to the second voltage reference for power, where the second voltage reference is independent of the first voltage reference, the switching circuit coupled to the input, the switching circuit configured to generate a data output signal referenced to the second voltage reference, where the data output signal changes with the data input signal when the switching circuit is enabled; and
   an enabling circuit coupled to the switching circuit for control of the switching circuit, the enabling circuit having an enable input referenced to the second voltage reference, where the enabling circuit is configured to be responsive to the enable input such that in an enabled state, the enabling circuit is configured to enable the switching circuit, and in a not enabled state, the enabling circuit is configured to set the data output signal to a predetermined level, wherein the switching circuit further comprises:
   a first NMOS transistor with a gate terminal, a source terminal, and a drain terminal, where the gate terminal is coupled, directly or indirectly, to the data input signal, and where the source terminal is coupled to a third voltage reference;
   a second NMOS transistor with a gate terminal, a source terminal, and a drain terminal, where the gate terminal is coupled to the output of the inverter; the drain terminal is coupled to a first node, and where the source terminal is coupled to the third voltage reference;
   a first PMOS transistor with a gate terminal, a source terminal, and a drain terminal, where the gate terminal is coupled to the first node, where the source terminal is coupled to the second voltage reference, where the drain terminal is coupled to a second node, where the second node is coupled to the drain terminal of the first transistor, where at least one of the first node or the second node is coupled to the data output signal;
   a second PMOS transistor with a gate terminal, a source terminal, and a drain terminal, where the gate terminal is coupled to the second node, where the source terminal is coupled to the second voltage reference, and where the drain terminal is coupled to the first node;
   wherein the enabling circuit further comprises:
   a third PMOS transistor with a gate terminal, a source terminal, and a drain terminal, where the gate terminal is coupled to the enable input, where the source terminal is coupled to the second voltage reference, and where the drain terminal is coupled to the second node; and
   a third NMOS transistor with a gate terminal, a source terminal, and a drain terminal, where the gate terminal is coupled to the second node, where the source terminal is coupled to the third voltage reference, and where the drain terminal is coupled to the first node.

6. The circuit as defined in claim 5, wherein the input circuit of the circuit further comprises a non-inverting buffer coupled to the data input signal, where an output of the non-inverting buffer is coupled to an input of the inverter and to the gate terminal of the first NMOS transistor.

7. The circuit as defined in claim 5, wherein the first voltage reference is about 1.8 volts, the second voltage reference is about 3.3 volts, and the third voltage reference is ground.

8. The circuit as defined in claim 5, further comprising a power monitor circuit, the power monitor circuit comprising:
   a fourth NMOS transistor with a gate terminal, a drain terminal, and a source terminal, where the gate terminal is coupled to the first voltage reference, where the drain terminal is coupled to the third node, and where the source terminal is coupled to a third voltage reference;
   a fourth PMOS transistor with a gate terminal, a drain terminal, and a source terminal, where the gate terminal is coupled to a fourth node, where the drain terminal is coupled to the third node, and where the source terminal is coupled to the second voltage reference;
   a fifth PMOS transistor with a gate terminal, a drain terminal, and a source terminal, where the gate terminal is coupled to the third node, and where the source terminal is coupled to the second voltage reference;
   a sixth PMOS transistor with a gate terminal, a drain terminal, and a source terminal, where the gate terminal is coupled to the first voltage reference, where the drain terminal is coupled to the third voltage reference, and where the source terminal is coupled to the fourth node;
   a voltage dropping circuit with an anode terminal and a cathode terminal, where the anode terminal is coupled to the drain of the fifth PMOS transistor, and where the cathode terminal is coupled to the fourth node; and
   an inverter having an input and an output, where the input of the inverter is coupled to the third node, and where the inverter is coupled to the second voltage reference for power, and wherein the output is operatively coupled to the enable input of the enabling circuit.

9. A circuit for voltage translation from a first voltage reference to a second voltage reference, the circuit comprising:
   an input coupled to a data input signal that is referenced to the first voltage reference, wherein the input further comprises an input circuit comprising an inverter coupled, directly or indirectly, to the input data input signal as an input, the inverter configured to generate an output that is an inverse of the data input signal, where the output of the inverter is referenced to the first voltage reference;
   a switching circuit coupled to the second voltage reference for power, where the second voltage reference is independent of the first voltage reference, the switching circuit coupled to the input, the switching circuit configured to generate a data output signal referenced to the second voltage reference, where the data output signal changes with the data input signal when the switching circuit is enabled; wherein the switching circuit further comprises:
   a first NMOS transistor with a gate terminal, a source terminal, and a drain terminal, where the gate terminal is coupled, directly or indirectly, to the data input signal, and where the source terminal is coupled to a third voltage reference;
   a second NMOS transistor with a gate terminal, a source terminal, and a drain terminal, where the gate terminal is coupled to the output of the inverter; the drain terminal is coupled to a first node, and where the source terminal is coupled to the third voltage reference;
   a first PMOS transistor with a gate terminal, a source terminal, and a drain terminal, where the gate terminal is coupled to the first node, where the source terminal is coupled to the second voltage reference, where the drain terminal is coupled to a second node, where the second node is coupled to the drain terminal of the first transistor, where at least one of the first node or the second node is coupled to the data output signal;
   a second PMOS transistor with a gate terminal, a source terminal, and a drain terminal, where the gate terminal is coupled to the second node, where the source terminal is coupled to the second voltage reference, and where the drain terminal is coupled to the first node; and
   an enabling circuit coupled to the switching circuit for control of the switching circuit, the enabling circuit having an enable input referenced to the second voltage reference, where the enabling circuit is configured to be responsive to the enable input such that in an enabled state, the enabling circuit is configured to enable the switching circuit, and in a not enabled state, the enabling circuit is configured to set the data output signal to a predetermined level, wherein the enabling circuit further comprises:
   a third PMOS transistor with a gate terminal, a source terminal, and a drain terminal, where the gate terminal is coupled to the enable input, where the source terminal is coupled to the second voltage reference, and where the drain terminal is coupled to the first node; and
   a third NMOS transistor with a gate terminal, a source terminal, and a drain terminal, where the gate terminal is coupled to the first node, where the source terminal is coupled to the third voltage reference, and where the drain terminal is coupled to the second node.

10. The circuit as defined in claim 9, wherein the input circuit of the circuit further comprises a non-inverting buffer coupled to the data input signal, where an output of the non-inverting buffer is coupled to an input of the inverter and to the gate terminal of the first NMOS transistor.

11. The circuit as defined in claim 9, further comprising a power monitor circuit with an enable output coupled to the enable input for control, where the power monitor circuit is configured to enable the switching circuit when both the first voltage reference and the second voltage reference are available and is configured to disable the switching circuit at least when the first voltage reference is not available.

12. The circuit as defined in claim 11, wherein the power monitor circuit has only active devices.

13. The circuit as defined in claim 11, wherein the power monitor circuit further comprises:
   a fourth NMOS transistor with a gate terminal, a drain terminal, and a source terminal, where the gate terminal is coupled to the first voltage reference, where the drain terminal is coupled to the third node, and where the source terminal is coupled to a third voltage reference;

a fourth PMOS transistor with a gate terminal, a drain terminal, and a source terminal, where the gate terminal is coupled to a fourth node, where the drain terminal is coupled to the third node, and where the source terminal is coupled to the second voltage reference;

a fifth PMOS transistor with a gate terminal, a drain terminal, and a source terminal, where the gate terminal is coupled to the third node, and where the source terminal is coupled to the second voltage reference;

a sixth PMOS transistor with a gate terminal, a drain terminal, and a source terminal, where the gate terminal is coupled to the first voltage reference, where the drain terminal is coupled to the third voltage reference, and where the source terminal is coupled to the fourth node; and a voltage dropping circuit with an anode terminal and a cathode terminal, where the anode terminal is coupled to the drain of the fifth PMOS transistor, and where the cathode terminal is coupled to the fourth node.

14. The power monitor circuit as defined in claim 13, further comprising an inverter having an input and an output, where the input of the inverter is coupled to the third node, and where the inverter is coupled to the second voltage reference for power.

15. The power monitor circuit as defined in claim 13, wherein the voltage dropping circuit comprises one or more gate-drain connected PMOS transistors, and wherein the output is operatively coupled to the enable input of the enabling circuit.

16. The power monitor circuit as defined in claim 13, wherein the voltage dropping circuit comprises one or more gate-drain connected NMOS transistors.

* * * * *